United States Patent [19]
Corisis et al.

[11] Patent Number: 6,091,133
[45] Date of Patent: *Jul. 18, 2000

[54] ASSEMBLY OF A SEMICONDUCTOR DEVICE AND PADDLELESS LEAD FRAME HAVING TAPE EXTENDING BETWEEN THE LEAD FINGERS

[76] Inventors: David J. Corisis, 961 W. Loon St., Meridian, Id. 83642; Larry D. Kinsman, HC33 Box 2461, Boise, Id. 83706-9736; Jerry M. Brooks, 1914 Ray Ave., Caldwell, Id. 83605

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 09/038,858

[22] Filed: Mar. 11, 1998

Related U.S. Application Data

[63] Continuation of application No. 08/618,359, Mar. 19, 1996, Pat. No. 5,729,049.

[51] Int. Cl.⁷ ............... H01L 23/48; H01L 23/50; H01L 23/12
[52] U.S. Cl. .......... 257/666; 257/711; 257/648; 257/783; 257/669; 257/672
[58] Field of Search ................ 257/666, 711, 257/648, 783, 669, 647, 668–672, 674, 729, 782

[56] References Cited

U.S. PATENT DOCUMENTS

| | | | |
|---|---|---|---|
| 4,033,844 | 7/1977 | Pantiga et al. | 204/224 R |
| 4,089,733 | 5/1978 | Zimmerman | 156/436 |
| 4,279,682 | 7/1981 | Hamagami et al. | 156/367 |
| 4,835,120 | 5/1989 | Mallik et al. | 438/118 |
| 4,862,245 | 8/1989 | Pashby et al. | 257/666 |
| 4,891,687 | 1/1990 | Mallik et al. | 257/676 |
| 4,894,752 | 1/1990 | Murata et al. | 361/421 |
| 5,140,404 | 8/1992 | Fogal et al. | 257/783 |
| 5,142,450 | 8/1992 | Olsen et al. | 361/421 |
| 5,177,032 | 1/1993 | Fogal et al. | 257/666 |
| 5,218,229 | 6/1993 | Farnworth | 257/476 |
| 5,227,662 | 7/1993 | Ohno et al. | 257/676 |
| 5,231,755 | 8/1993 | Emanuel | 29/827 |
| 5,252,853 | 10/1993 | Michii | 257/666 |
| 5,286,679 | 2/1994 | Farnworth et al. | 438/118 |
| 5,304,842 | 4/1994 | Farnworth et al. | 257/668 |
| 5,331,200 | 7/1994 | Teo et al. | 257/666 |
| 5,352,633 | 10/1994 | Abbott | 29/827 |
| 5,471,369 | 11/1995 | Honda et al. | 257/778 |
| 5,475,918 | 12/1995 | Kubota et al. | 29/827 |
| 5,529,937 | 6/1996 | Chan | 228/189 |
| 5,536,969 | 7/1996 | Matsuoka | 257/668 |
| 5,543,363 | 8/1996 | Tokunoh et al. | 257/688 |
| 5,696,032 | 12/1997 | Phelps, Jr. et al. | 438/111 |
| 5,729,049 | 3/1998 | Corisis et al. | 257/666 |
| 5,763,945 | 6/1988 | Corisis et al. | 257/676 |

FOREIGN PATENT DOCUMENTS

| | | | |
|---|---|---|---|
| 60-105658 | 7/1985 | Japan . | |
| 2156547 | 6/1990 | Japan . | |
| 3035589 | 2/1991 | Japan . | |
| 435057 | 2/1992 | Japan | 257/670 |
| 4150061 | 5/1992 | Japan | 257/670 |
| 6216302 | 8/1994 | Japan | 257/669 |

*Primary Examiner*—Alexander Oscar Williams
*Attorney, Agent, or Firm*—Trask, Britt & Rossa

[57] ABSTRACT

A semiconductor integrated circuit device, and method of manufacturing the same, having a conventional-type lead frame with the die paddle removed. In particular, the die paddle is replaced with a section of tape that is supported by the ends of the lead fingers. The semiconductor die is attached to the tape so that it may be wire bonded to the lead fingers. The tape contains at least one slot to allow for expansion and/or contraction of the tape due to various temperatures experienced during the manufacturing process so that the tape does not wrinkle or warp to alter the position of the die.

60 Claims, 11 Drawing Sheets

ASSEMBLY OF A SEMICONDUCTOR DEVICE AND PADDLELESS LEAD FRAME HAVING TAPE EXTENDING BETWEEN THE LEAD FINGERS

This is a continuation of Ser. No. 08/618,359 filed Mar. 19, 1996, now U.S. Pat. No. 5,729,049.

BACKGROUND OF THE INVENTION

1. Field of the Invention

This invention relates generally to semiconductor integrated circuit (IC) devices, more specifically, to a method and apparatus for a semiconductor device utilizing a conventional-type lead frame with no die paddle and having a section of tape to support the semiconductor die.

2. State of the Art

The semiconductor industry has become one of the most competitive industries in the world. It is thus essential for manufacturers to minimize the per unit production cost while simultaneously increasing the number of units manufactured. Because of the high volume of manufactured products associated with semiconductor fabrication, small changes in production throughput times per semiconductor device can make dramatic changes in the number of devices produced. Moreover, decreasing the number of defective devices produced, even by a small amount, can have a similar dramatic effect on the overall production rate.

One method and semiconductor device construction that has been recognized is to use an adhering member to retain the lead fingers of a lead frame having a semiconductor support therewith during the wire bonding operation of leads between the semiconductor device and each lead finger. Such methods and semiconductor devices are illustrated in U.S. Pat. Nos. 4,835,120, 4,891,687, 5,227,662, 5,352,633, and 5,475,918.

Another method and semiconductor device construction that has been recognized is the lead-over-hip (LOC) configuration. In this configuration, the lead frame has no semiconductor paddle support as a part thereof. Rather, the semiconductor device is supported in relation to the lead frame and its lead fingers by means of adhesive tape securing the semiconductor device to the lead fingers overlaying the semiconductor device during wire bonding and other operations. Typical LOC type methods and semiconductor devices are illustrated in U.S. Pat. Nos. 4,862,245, 5,252,853, 5,304,842, and 5,471,369.

The manufacturing advantages of having a paddleless, conventional-type lead frame have also been recognized in the art. For example, as illustrated in U.S. Pat. No. 5,140,404, assigned to the assignee of the present invention, the die paddle is replaced with tape. The tape is attached to the underside of the lead fingers and extends over the portion of the lead frame where the die paddle would normally be located. The tape serves at least two functions. First, it provides a platform to support the semiconductor die, and second, it stabilizes the ends of the lead fingers during the wire bonding operation. Moreover, because the tape is attached to one side of the lead frame, it provides substantially the same downset to lower the die relative to the top surface of the lead fingers. Thus, the semiconductor die is attached to and supported by the tape during wire bonding of the contacts of the die to the lead fingers.

However, rather than use thermosetting adhesives to attach the lead fingers of the lead frame to the tape and the semiconductor, as in the process illustrated in the '404 patent, one or more thermoplastic layers are applied to a tape which is subsequently used to support the semiconductor device in a conventional-type lead frame having no semiconductor support paddle therewith. The lead fingers of the lead frame are bonded to the semiconductor device during the wire bonding operation. Since the use of one or more thermoplastic layers on a tape to support the semiconductor device as well as lock the lead fingers of the lead frame in place is in place of typical adhesives which require subsequent oven curing steps, such use of thermoplastic layers requires the substantially simultaneous bonding of both the semiconductor device and the lead fingers of the lead frame to the tape while the thermoplastic remains in its soft state. Furthermore, since the thermoplastic typically melts at 100 degrees Centigrade and the wire bonding of the lead fingers to the semiconductor device occurs when both are heated to approximately 250 degrees Centigrade, the thermoplastic may soften during the wire bonding process thereby allowing the semiconductor device and/or lead fingers to move causing bonding problems.

When the lead frame is being manufactured, if the lead fingers of a lead frame have been locked in place through the use of thermosetting types of adhesives, rather than thermoplastic types of adhesive as described in the '404 patent, subsequently, it is easier to use a thermosetting type of adhesive to attach the semiconductor device on the tape in the paddleless lead frame as conventional semiconductor processing is capable of such adhesive use and curing without modification to the fabrication process.

From the foregoing, it has been recognized in the art to increase chip production efficiency while simultaneously decreasing the number of defective products, it is desirable to utilize a conventional-type lead frame without a die paddle and use tape to retain the chip in the lead flame as well as to retain the lead fingers of the lead frame during wire bonding operations.

In a conventional-type lead frame, the lead fingers, which form the leads of the packaged semiconductor device, inwardly extend toward the center of the lead frame. A die paddle is positioned proximate the tips or proximal ends of the lead fingers and is generally rectangular in shape. The die paddle provides a relatively stable base to mount the semiconductor die and keep the semiconductor die in place during various manufacturing operations where die alignment is crucial, such as wire bonding.

The die paddle is typically positioned on a lower plane than the plane defined by the lead fingers such that when the semiconductor die is attached to the die paddle in this configuration, the lowered die paddle decreases the angle and length of wire necessary to wire bond the contacts of the semiconductor die to the ends of the lead fingers. Having the die paddle on a lower plane is more difficult to manufacture and may create various handling problems during the manufacturing process. For example, modified or alternate fixtures for handling lead frames with a lowered die paddle, as opposed to lead frames where the die paddle is not lowered, may be necessary. Additionally, the ends of the lead fingers that are wire bonded are typically plated with gold or silver. Plating part of the die paddle is also desirable if a down bond is needed to secure the semiconductor die to the die paddle.

During the wire bonding operation, the lead frame, along with its attached die, is typically placed on a heating block to heat the lead flame and die to a specific temperature. Typically, the heating block heats the semiconductor device to approximately 250 degrees Centigrade. Accordingly, any type of tape used to support the die to the lead frame, as previously discussed, must be capable of withstanding temperatures of approximately 250 degrees Centigrade without melting and/or distorting from expansion. If the tape does warp or wrinkle from the heat, the semiconductor die may move relative to the lead fingers and/or the lead fingers may move relative to the semiconductor die. Any such movement may cause misalignment of the lead fingers in relation to the die contacts during the wire bonding operation resulting in improper wire bonding and production of a defective semiconductor device. Moreover, if the wire bonding operation successfully wire bonds each of the die contacts to the lead fingers, cooling of warped or wrinkled tape may cause the die to pull apart the wire bonds. Thus, it would be advantageous to provide a tape supported lead frame for die attachment that also addresses the effects of expansion and/or contraction of the tape used to support the semiconductor die. It would also be advantageous to provide a tape supported lead frame for die attachment that further addresses the effects of attaching the die through the use of thermosetting adhesives, rather than thermoplastic adhesives which are soft when the die is attached or may soften during the wire bonding process thereby allowing the die or lead fingers to move with respect to each other.

SUMMARY OF THE INVENTION

According to the present invention, a conventional-type, paddleless lead frame is provided having at least one piece of tape extending to and between the lead fingers where a die paddle would normally lie in a conventional-type lead frame. The tape is of a generally rectangular configuration, but may also be in the form of a circle, oval, parallelogram or any other shape that would fit within the footprint defined by the outside edge of packaging encapsulant. A semiconductor die is then attached to the tape between the proximal ends of the lead fingers using thermosetting types of adhesives. The lead fingers are also attached to the tape through the use of thermosetting types of adhesives.

In a preferred embodiment, the piece of tape has at least one slot formed therein to allow the tape to expand and contract as it is heated and cooled without moving the semiconductor die attached thereto. Also, the slot permits improved adhesion of the lead fingers and the semiconductor die to the tape during heating and cooling.

In another preferred embodiment, the die supporting tape includes two transversely extending, substantially parallel slots. The two slots extend along opposite sides of the tape and are proximate the proximal ends of some of the lead fingers. The two slots may also extend along either of the two substantially parallel sides of the tape and may have substantially squared or curved ends.

In yet another preferred embodiment, the tape includes four slots forming a crossing pattern. The four slots may be substantially parallel to the sides of the tape or extend substantially diagonally across the tape.

In still another embodiment, the slots are formed from a series of apertures that may be of varying or substantially similar shapes and sizes. For example, each slot may be formed of a row of substantially rectangular or square apertures extending along two or four sides of the tape. Moreover, the apertures may form a grid-like pattern over a substantial portion of the tape.

In yet another preferred embodiment, the die supporting tape is comprised of at least two pieces of tape with a slot formed by the separating distance between the pieces of tape. Each piece of tape may also have its own opening or slot formed therein to further allow for expansion or contraction of the tape.

It is believed that a major aspect of the invention is that the tape used to support the die can accommodate a certain amount of expansion and/or contraction from heating or cooling by including an aperture therein without disturbing the alignment of the semiconductor die. This can be accomplished by having an aperture formed into the tape itself or using a number of pieces of tape with openings formed in between the pieces. These, and other features of the present invention, will become apparent from the following detailed description, the accompanying drawings, and the appended claims.

DETAILED DESCRIPTION OF THE ILLUSTRATED EMBODIMENT

Figure 1:
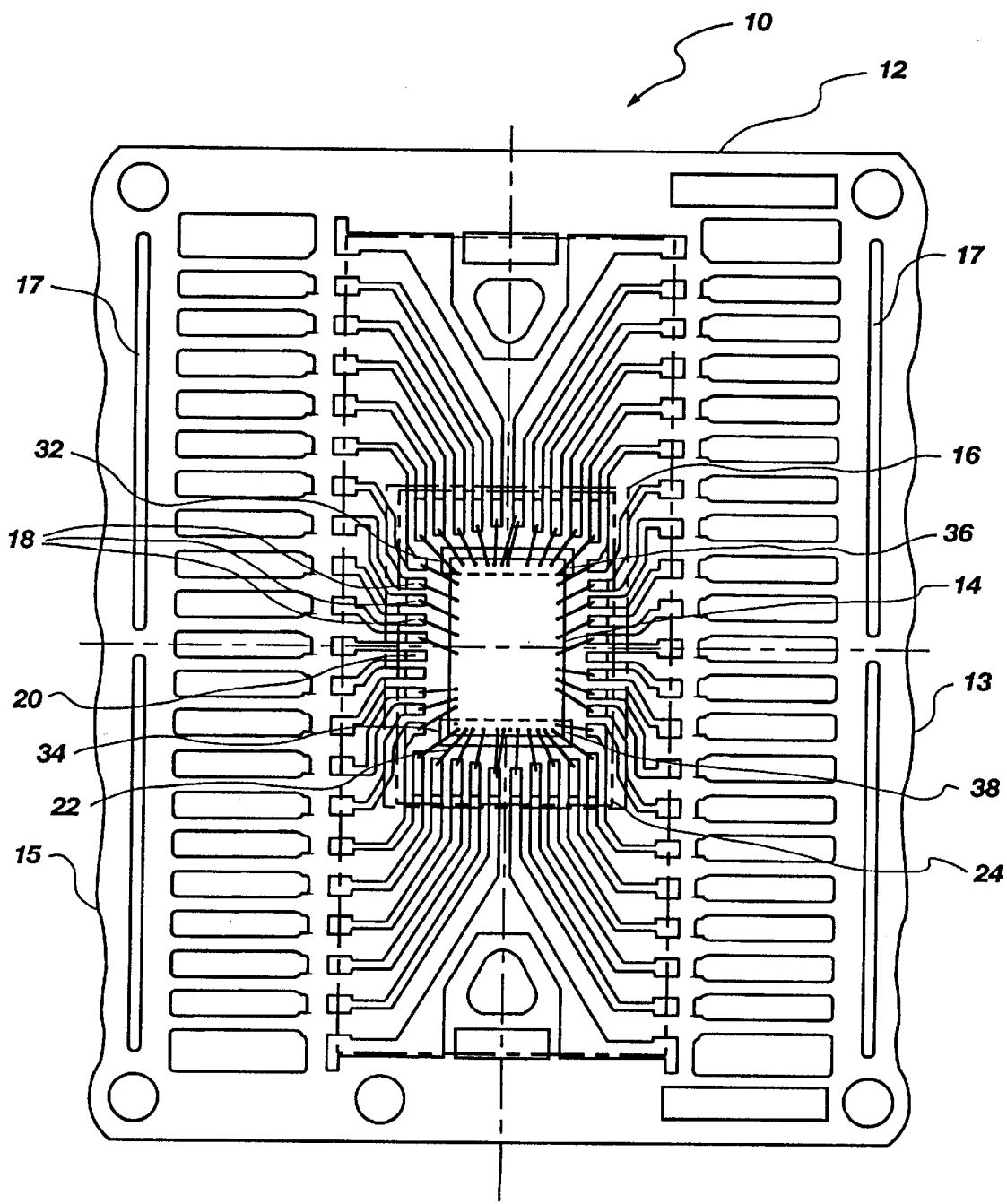
FIG. 1 is a schematic top view of a semiconductor integrated circuit device in accordance with the present invention including a first embodiment of a tape segment.

Referring to FIG. 1, a semiconductor integrated circuit (IC) device 10 is shown including a portion of a conventional-type lead frame 12. Typically, the lead frame 12 is part of a lead frame strip comprised of a plurality of lead frames extending from broken edges 13 and 15 and are repeated about the slits 17. The lead frame 12 includes a plurality of lead fingers 18 that extend toward the center of the lead frame 12. Each of the lead fingers 18 includes a lead end 20 at a proximal end that is wire bonded to the semiconductor die 14 by wire bond 22. Typically, the lead ends 20 are plated to achieve a sufficient bond between the wire bond 22 and the lead end 20. The plated area is generally indicated by dashed line 24.

As should be recognized, the lead frame 12 does not include a die paddle for supporting the semiconductor die 14. Rather, the semiconductor die 12 is supported by tape 16.

Figure 2:
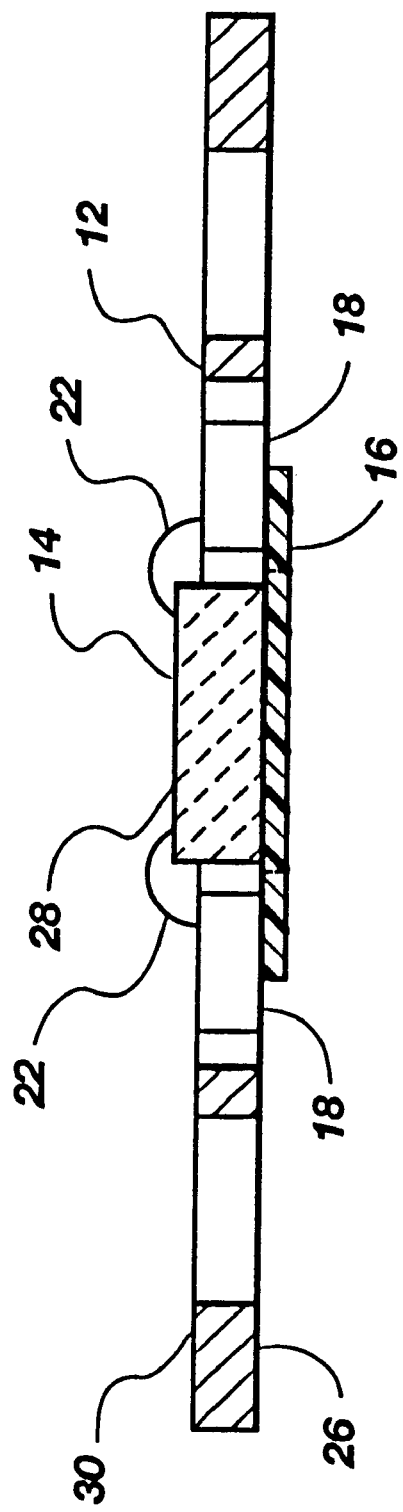
FIG. 2 is a schematic side view of the semiconductor integrated circuit device of FIG. 1.

As better seen in FIG. 2, the tape 16 is attached to the bottom surface 26 of the lead frame 12 preferably using a thermosetting type of adhesive. When a semiconductor die 14 is subsequently attached to the tape 16, preferably using a thermosetting type of adhesive, the die 14 sits down inside the lead frame 12. In this manner, the length of a wire bond 22 between the die 14 and the lead finger 18 is decreased because the top surface 28 of the die 14 is positioned closer to the top surface 30 of the lead frame 12, as opposed to a die attached to the top surface of a lead frame having a die paddle that is not lowered. The preferred type of adhesive used to bond the lead fingers 18 of the lead frame 12 and the semiconductor die 14 to the tape 16 may be selected from the group of epoxies, acrylics, silicones and polyamides, such adhesives being thermosetting, i.e., capable of irreversibly polymerizing and setting or hardening when heated to some appropriate temperature. Such adhesives are not being thermoplastic; i.e., a material that can be repeatedly melted or softened by heat without a change of properties. When such adhesives are used to bond the lead fingers 18 of the lead flame 12 to the tape 16, since the adhesive must be cured, typically in an oven, it is necessary to bond the lead fingers 18 to the tape 16 before bonding the semiconductor die 14 to the tape 16. In this manner, the lead fingers 18 of the lead frame 12 are fixed or locked in position by the tape 16 with the semiconductor die 14 being subsequently locked in position on the tape 16 with respect to the lead fingers 18. While the lead fingers 18 may engage the tape 16 over any desired length thereof, the tape 16 preferably engages the lead fingers 18 over a length of at least 0.005 inches and may be in excess of 0.060 inches.

Referring again to FIG. 1, the tape 16 includes two slots 32 and 34 transversely extending across the tape 16 proximate a number of lead ends 20. As shown, the ends 36 and 38 of the die 14 extend into the slots 32 and 34, respectively. The slots 32 and 34 may, however, be entirely outside or inside the footprint of the die 14. Moreover, the slots 32 and 34 are longer than the corresponding width of the die. However, the slots 32 and 34 may be shorter or longer, depending on the size of the die used and/or the desires of the manufacturer.

Figure 3:
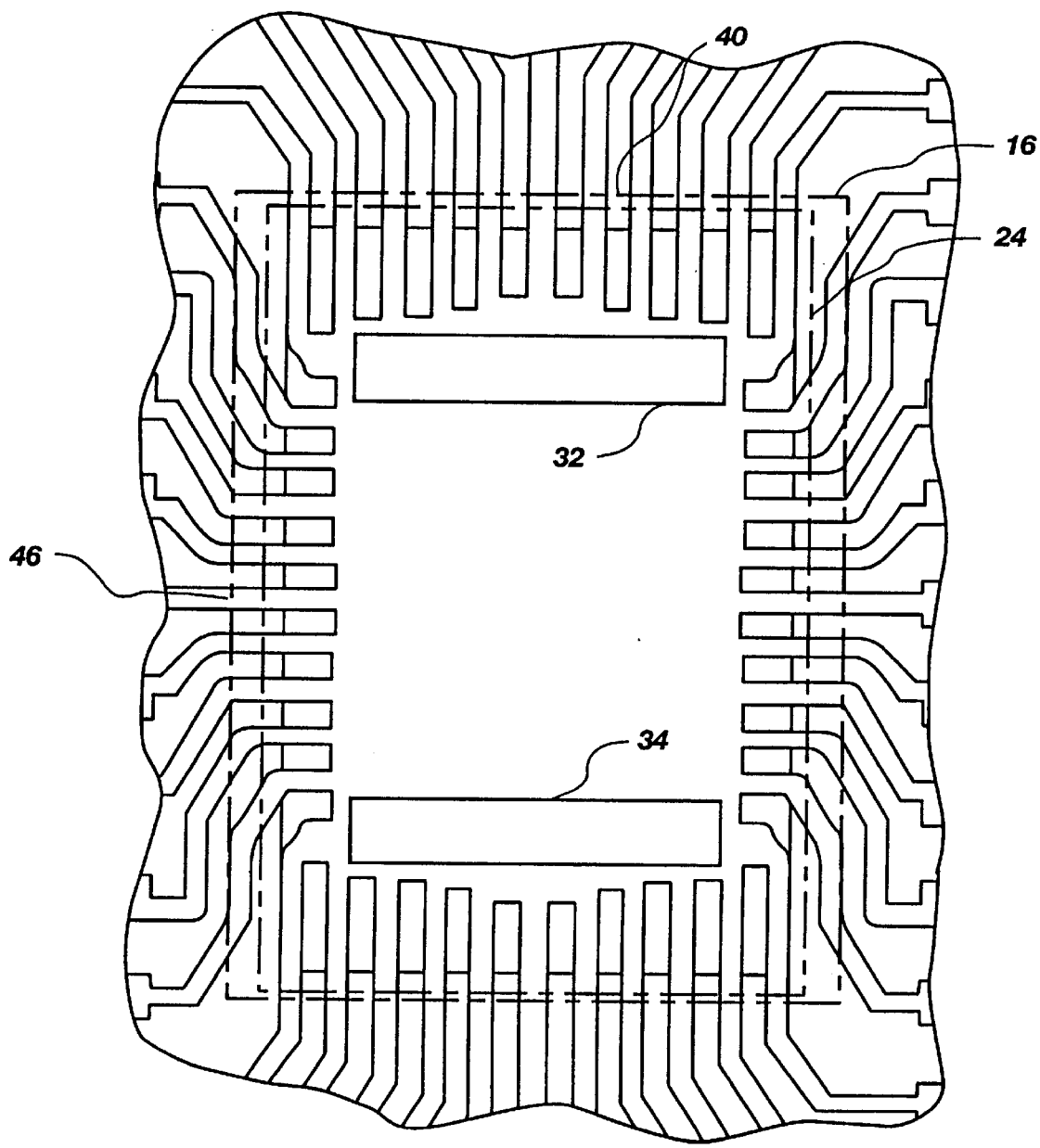
FIG. 3 is a close-up partial top view of the lead fingers and tape configuration of FIG. 1 without an associated semiconductor die.
Figure 4:
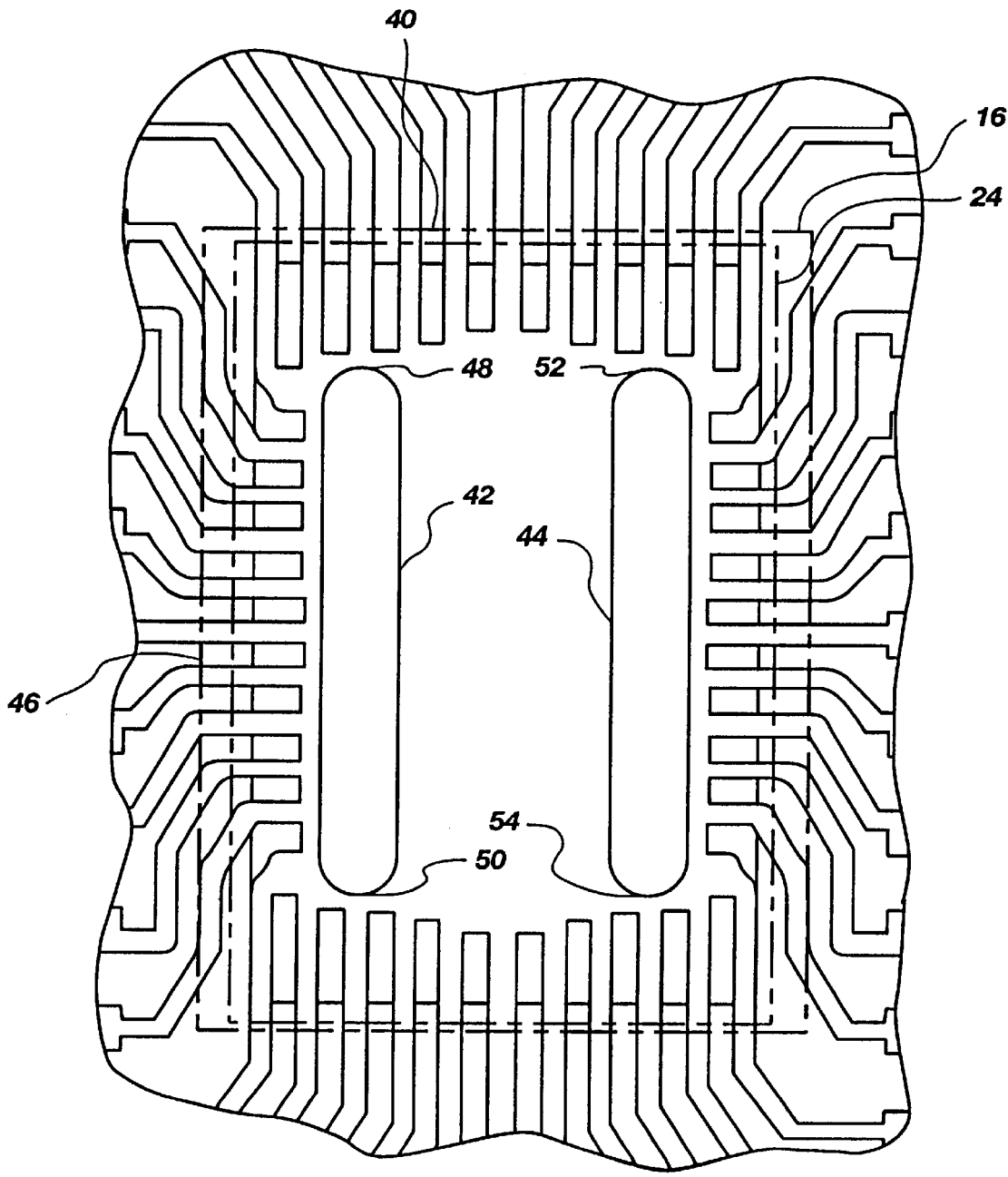
FIG. 4 is a close-up partial top view of a second embodiment of the lead fingers and tape configuration in accordance with the present invention.

As shown in FIG. 3, the slots 32 and 34 may transverse the short side 40 of the tape 16 and have a generally rectangular configuration. Similarly, the slots 42 and 44 shown in FIG. 4 may transverse the long side 46 of the tape 16 and have rounded ends 48, 50 and 52, 54, respectively.

Figure 5:
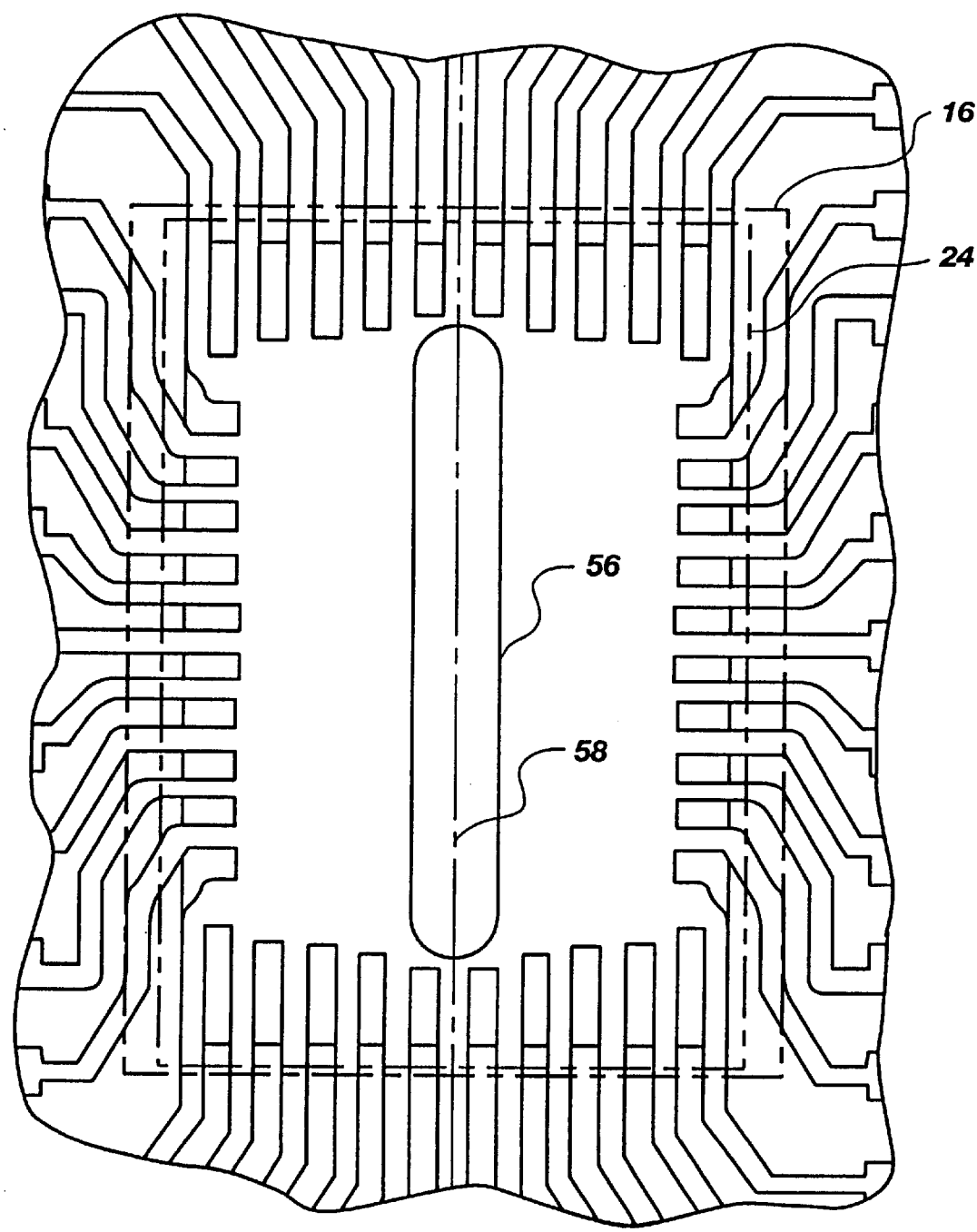
FIG. 5 is a close-up partial top view of a third embodiment of the lead finger and tape configuration in accordance with the present invention.
Figure 6:
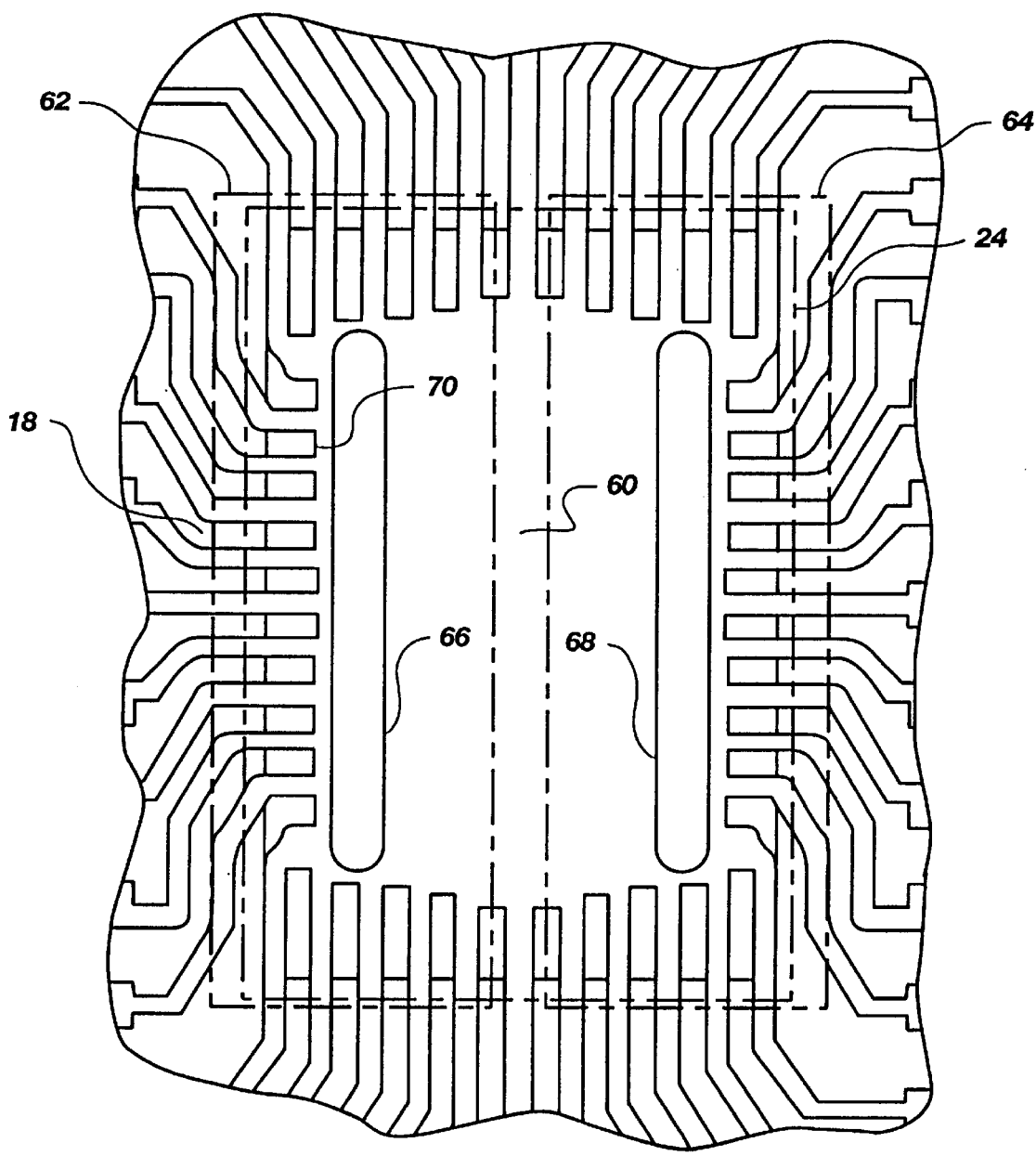
FIG. 6 is a close-up partial top view of a fourth embodiment of the lead fingers and tape configuration in accordance with the present invention.

It may, however, not be necessary to incorporate more than one slot in the tape 16 to achieve the necessary give in the tape 16 to allow for expansion and/or contraction of the tape 16. For example in FIG. 5, a single slot 56 may transverse the tape 16 about the center line 58. Moreover, as shown in FIG. 6, the slot or opening 60 may actually be formed by spacing apart two tape segments 62 and 64. In addition, each segment of tape 62 and 64 may each include their own transverse apertures 66 and 68, respectively, positioned proximate several proximate ends 70 of the lead fingers 18.

Figure 7:
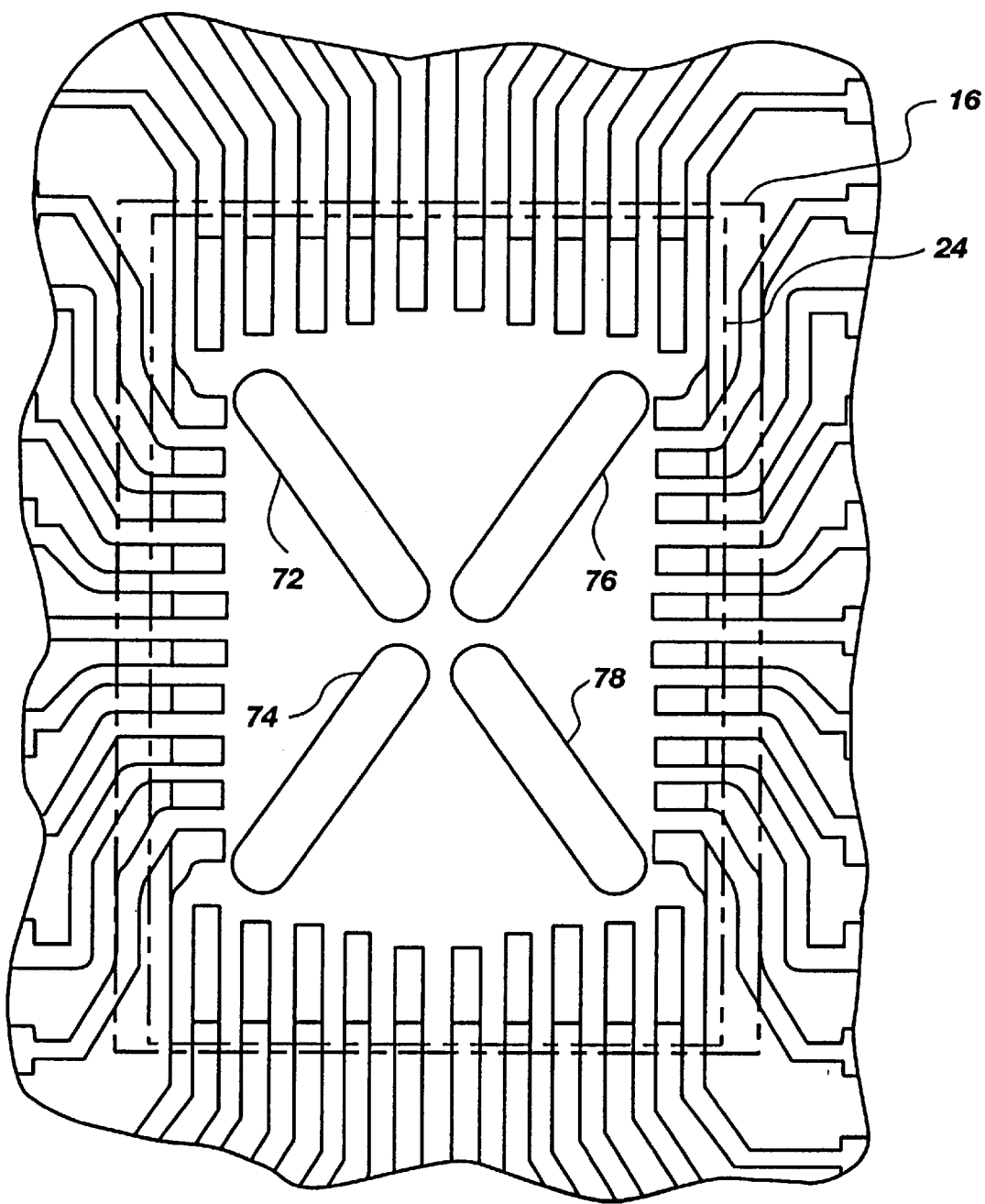
FIG. 7 is a close-up partial top view of a fifth embodiment of the lead fingers and tape configuration in accordance with the present invention.
Figure 8:
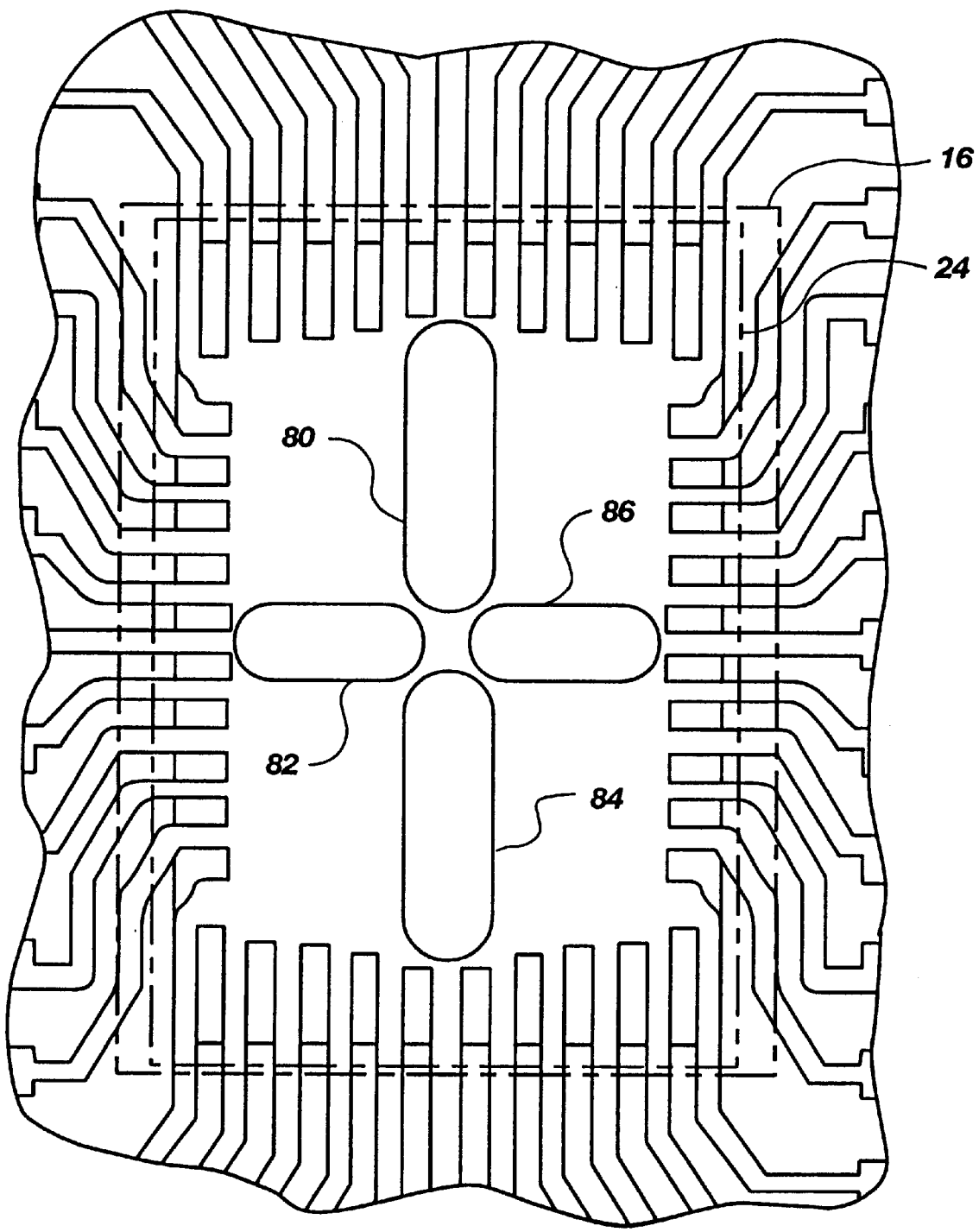
FIG. 8 is a close-up partial top view of a sixth embodiment of the lead fingers and tape configuration in accordance with the present invention.

It may also be desirable to incorporate more than two slots and position the slots so that they are not substantially parallel to one another. For example in FIG. 7, the slots 72, 74, 76, and 78 are substantially diagonally positioned across the tape 16 to form an "X" pattern. Likewise, the slots 80, 82, 84, and 86 may form a cross-like pattern in the tape 16, as shown in FIG. 8.

Figure 9:
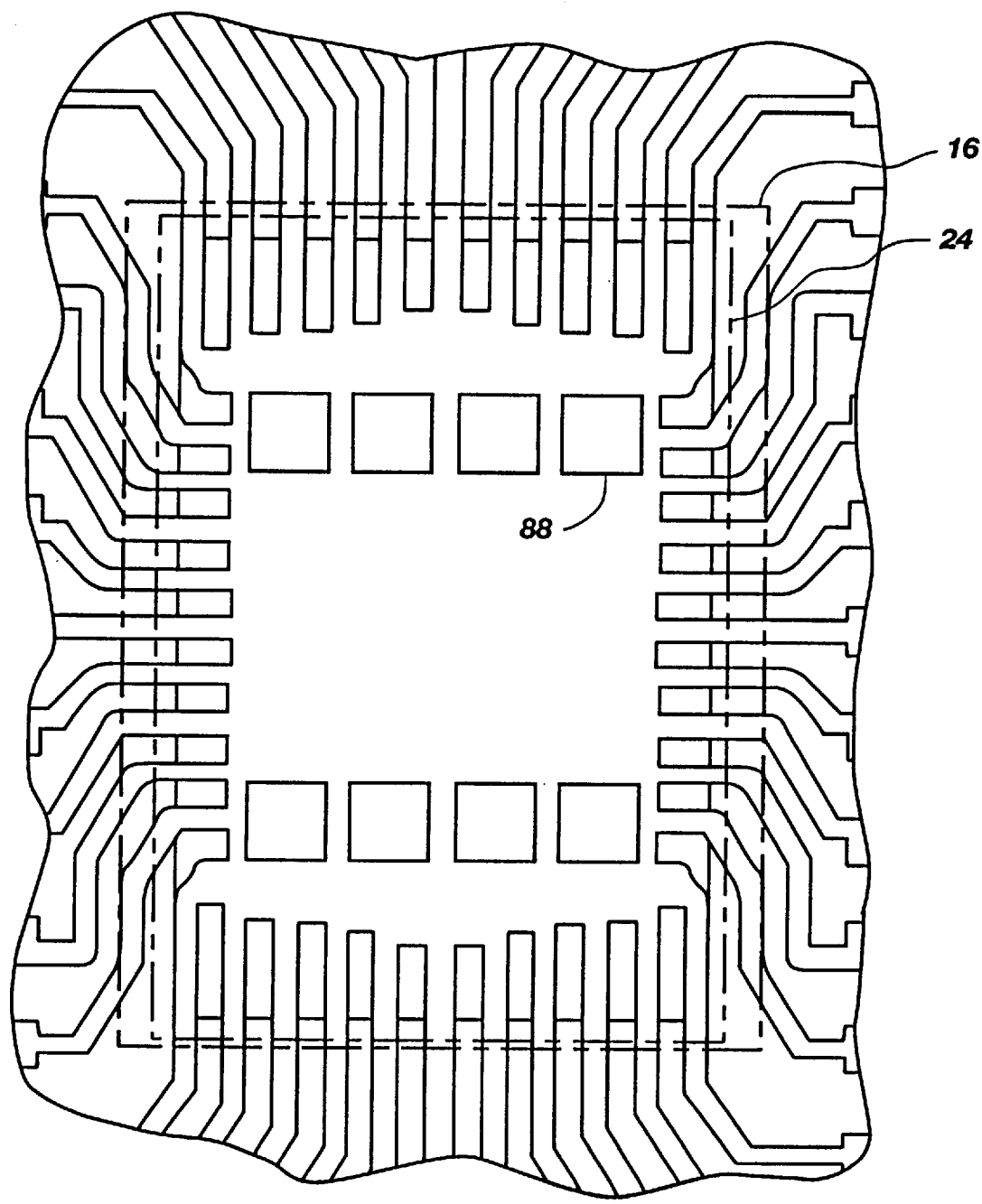
FIG. 9 is a close-up partial top view of a seventh embodiment of the lead fingers and tape configuration in accordance with the present invention.

Referring now to FIG. 9, each slot may be formed from a plurality of apertures 88 positioned to form any of the previously described configurations or any other configuration as desired. In this embodiment, the apertures are configured similar to the embodiment shown in FIG. 3, but may be altered in size, shape, and/or number.

Figure 10:
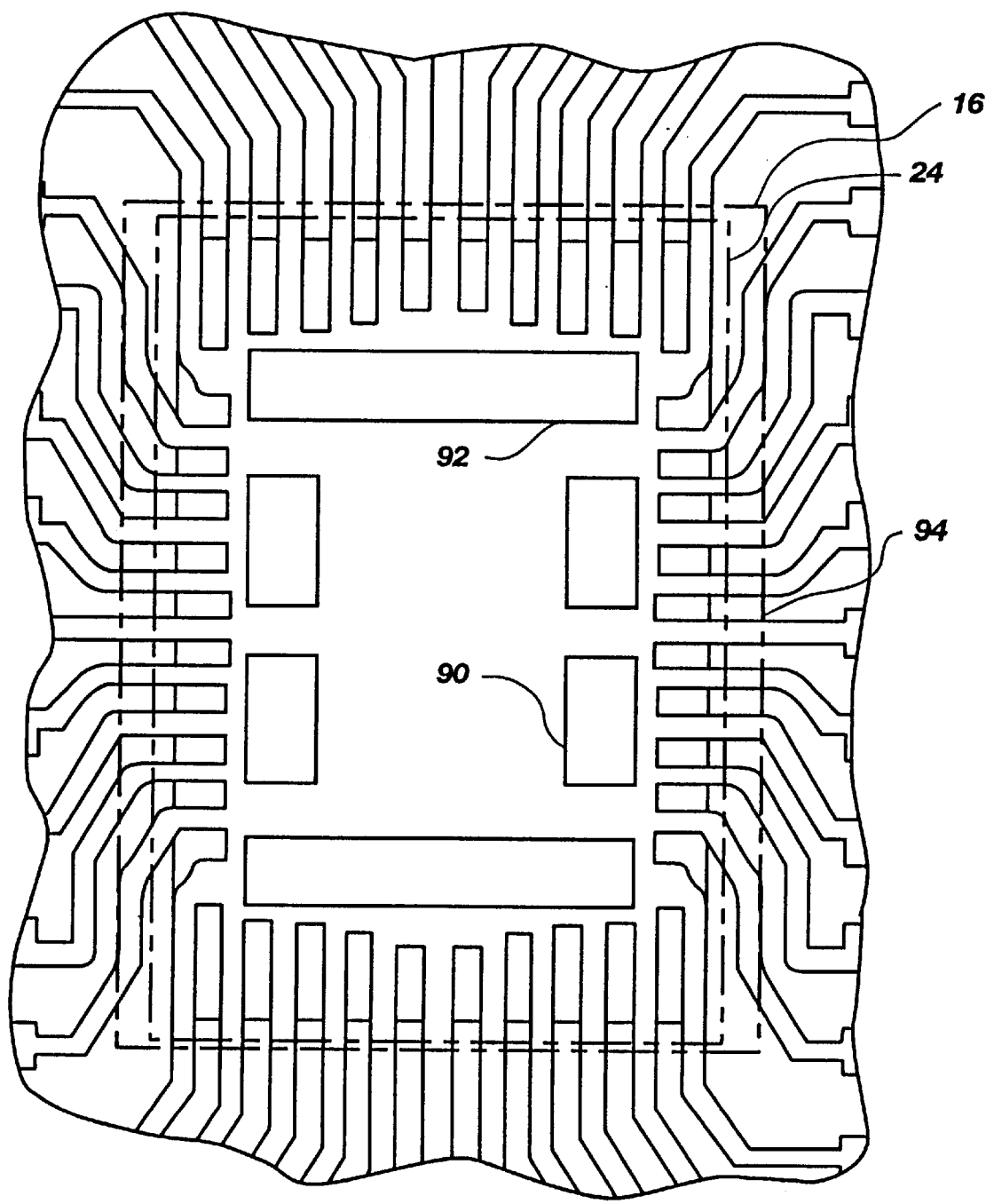
FIG. 10 is a close-up partial top view of an eighth embodiment of the lead fingers and tape configuration in accordance with the present invention.

As shown in FIG. 10, the apertures may include both relatively smaller apertures 90 and larger apertures 92 and may be positioned proximate the perimeter 94 of the tape 16.

Figure 11:
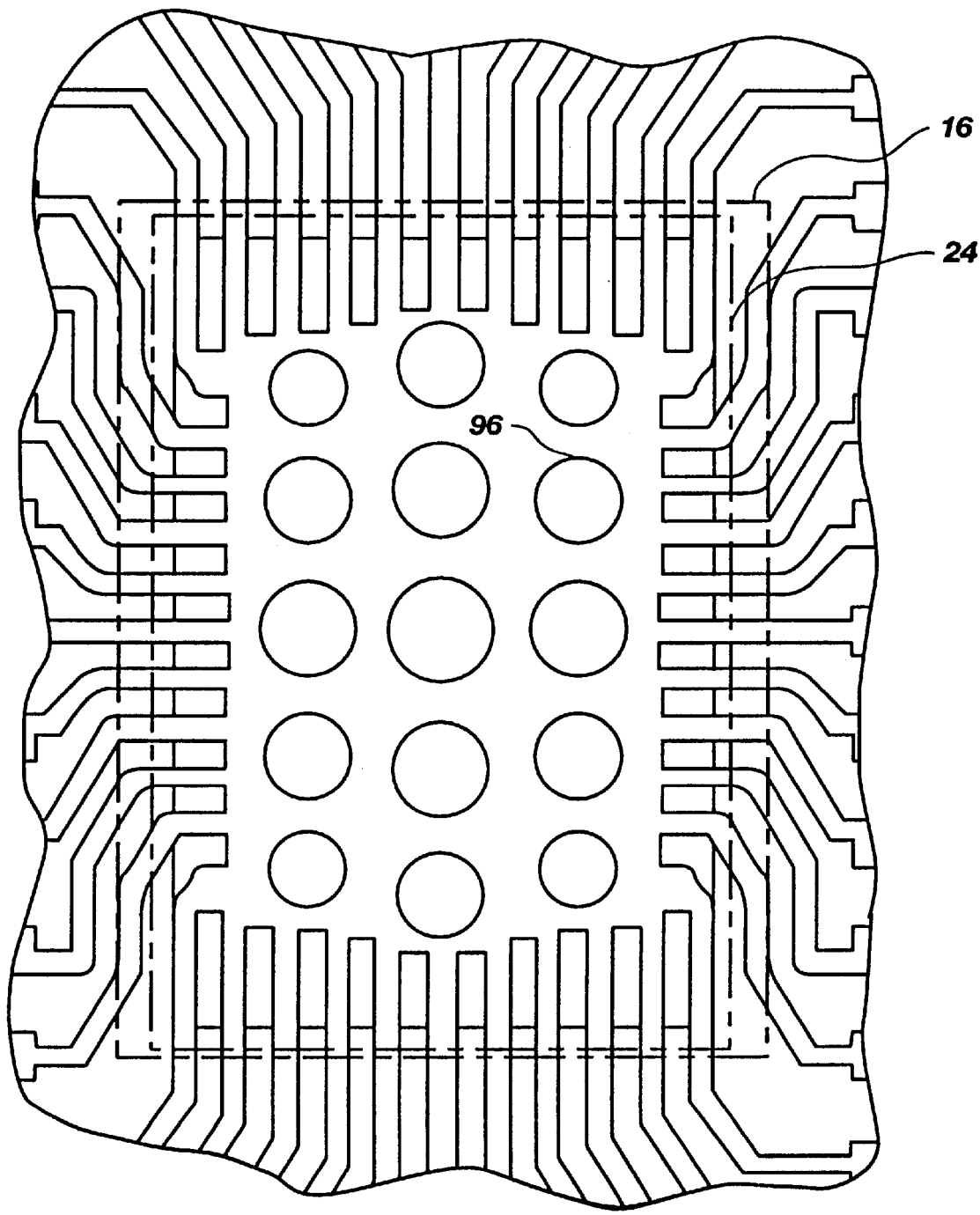
FIG. 11 is a close-up partial top view of a ninth embodiment of the lead fingers and tape configuration in accordance with the present invention.

Finally, as shown in FIG. 11, it may be desirable to form a grid-like pattern of slots or apertures 96 over a substantial portion of the tape 16. The apertures 96 may be all substantially the same size or varying in size as illustrated.

In the exemplary embodiments, the tape as illustrated has a generally rectangular configuration, and the illustrated slot configurations are generally symmetrical about one lead frame axis or another. Those skilled in the art, however, will appreciate that the size and/or shape of the tape may vary and the slots may equally be asymmetrically positioned about the tape without departing from the spirit of the present invention. It will also be appreciated by one of ordinary skill in the art that one or more features of the illustrated embodiments may be combined with one or more features from another to form yet another combination within the scope of the invention as described and claimed herein. Thus, while certain representative embodiments and details have been shown for purposes of illustrating the invention, if will be apparent to those skilled in the art that various changes in the invention disclosed herein may be made without departing from the scope of the invention, which is defined in the appended claims. For example, various slot configurations may be utilized; the number of apertures may be increased or decreased; and the number of tape segments may be varied.

What is claimed is:

1. A lead frame connected to a semiconductor device thereto, the lead frame comprising:

a lead frame including a plurality of lead fingers, the plurality of lead fingers each having a proximal end inwardly extending to define a semiconductor device opening in the lead frame, the lead frame having no portion thereof for the supporting of said semiconductor device; and a section of tape having a periphery and a central portion, the section of tape attached proximate the periphery thereof to at least a portion of the proximate ends of the plurality of lead fingers of the lead frame by substantially bonding the lead fingers to the tape through the use of a thermosetting adhesive.

2. The lead frame of claim 1, wherein said section of tape is substantially rectangular in shape.

3. The lead frame of claim 2, further including at least one aperture therein.

4. The lead frame of claim 3, wherein the at least one aperture comprises at least one slot extending across a portion of said section of tape.

5. The lead frame of claim 4, wherein the slot is positioned proximate a first portion of the proximal ends of the plurality of lead fingers.

6. The lead frame of claim 4, further comprising:

a second slot is positioned proximate a second portion of the proximal ends of the plurality of lead fingers.

7. The lead frame of claim 3, wherein said at least one aperture includes a slot substantially diagonally extending across the section of tape.

8. The lead frame of claim 3, wherein said at least one aperture comprises a slot extending transversely across the section of tape.

9. The lead frame of claim 3, wherein the at least one aperture includes a grid of slots in the section of tape in at least a portion of the semiconductor device opening.

10. The lead frame of claim 1, further including:
    said semiconductor device is connected to and supported by the section of tape.

11. The lead frame of claim 3, wherein the semiconductor device extends over at least a portion of the at least one aperture.

12. The lead frame of claim 10, wherein the section of tape is substantially adhesively attached through the use of a thermosetting adhesive to portions of the plurality of lead fingers and the semiconductor device.

13. The lead frame of claim 1, wherein the section of tape is formed of the group comprising plastic and polyamide.

14. The lead frame of claim 1, wherein the adhesive includes the group of epoxies, acrylics, silicones and polyamides.

15. The lead frame of claim 10, wherein the adhesive substantially bonding the semiconductor device to the section of tape includes the group of epoxies, acrylics, silicones and polyamides.

16. The lead frame of claim 1, further including:
    said semiconductor device is connected to and supported by the section of tape by substantially bonding the semiconductor device to the tape through the use of an adhesive wherein the adhesive is heated to bond the semiconductor device to the section of tape.

17. The lead frame of claim 1, wherein:
    said semiconductor device is connected to and supported by the section of tape, the semiconductor connected to the section of tape using an adhesive including substantially an epoxy paste.

18. The lead frame of claim 1, wherein:
    said semiconductor device is connected to and supported by the section of tape, the semiconductor devices connected to the section of tape using an adhesive including substantially polyamide.

19. A lead frame for use with a semiconductor device, the lead frame comprising:
    a lead frame including a plurality of lead fingers, the plurality of lead fingers each having a proximal end inwardly extending to define an opening in the lead frame for said semiconductor device, the lead frame having no die paddle for the supporting of said semiconductor device; and
    a section of tape having a periphery, a central portion, and at least one slot formed therein, the section of tape attached to at least a portion of the proximal ends of the plurality of lead fingers of the lead frame.

20. The lead frame of claim 19, wherein said section of tape is substantially rectangular in shape.

21. The lead frame of claim 20, wherein said at least one slot transversely extends across a portion of said section of tape.

22. The lead frame of claim 21, further including at least two slots longitudinally extending across a portion of said section of tape.

23. The lead flame of claim 21, wherein a first slot of said at least two slots is positioned proximate a first portion of the proximal ends of the plurality of lead fingers and a second slot of said at least two slots is positioned proximate a second portion of the proximal ends of the plurality of lead fingers.

24. The lead frame of claim 20, wherein said at least one slot substantially diagonally extends across the section of tape.

25. The lead frame of claim 20, wherein said at least one slot extends substantially transversely across the section of tape.

26. The lead frame of claim 20, wherein the at least one slot includes a grid of slots in the section of tape in at least a portion of the opening in the lead frame for said semiconductor device.

27. The lead frame of claim 19, wherein said semiconductor device is connected to and supported by the section of tape.

28. The lead frame of claim 27, wherein the semiconductor device extends over at least a portion of the at least one slot.

29. The lead frame of claim 28, wherein the section of tape is adhesively attached to at least a portion of the plurality of lead fingers.

30. The lead frame of claim 19, wherein the section of tape is formed of the group comprising plastic and polyamide.

31. The lead frame of claim 30, wherein the section of tape can withstand temperatures of substantially at least 250 degrees Centigrade.

32. The lead frame of claim 19, wherein the section of tape covers substantially at least 0.005 inches of the proximal ends of a portion of the lead fingers.

33. An assembly of a semiconductor integrated circuit device and a lead frame, said assembly comprising:
    a conventional-type lead frame including a periphery, a central portion, a center axis and a plurality of lead fingers, the plurality of lead fingers each having a proximal end inwardly extending to define a semiconductor integrated circuit device opening in the conventional-type lead frame; and
    a section of tape having a periphery and a central portion, the section of tape attached to at least a portion of the proximal ends of the plurality of lead fingers.

34. The assembly of claim 33, wherein the section of tape is substantially rectangular in shape.

35. The assembly of claim 33, further including at least two slots transversely extending across a portion of the section of tape.

36. The assembly of claim 33, further including at least two slots longitudinally extending across a portion of the section of tape.

37. The assembly of claim 35, wherein a first slot of said at least two slots is positioned proximate a first portion of the proximal ends of the plurality of lead fingers and a second slot of said at least two slots is positioned proximate a second portion of the proximal ends of the plurality of lead fingers.

38. The assembly of claim 33, wherein at least one slot substantially diagonally extends across the section of tape.

39. The assembly of claim 33, further including:
    at least one slot extending substantially transversely of the section of tape.

40. The assembly of claim 33, further including:
    at least one slot substantially forming a grid of slots in the section of tape in at least a portion of the central portion of the section of tape.

41. The assembly of claim 33, further including a semiconductor device attached to and supported by the section of tape.

42. The assembly of claim 39, wherein the semiconductor integrated circuit device extends over at least a portion of the at least one slot.

43. The assembly of claim 33, wherein the section of tape is adhesively substantially attached to said plurality of lead fingers.

44. The assembly of claim 33, wherein the section of tape is formed of the group comprising plastic and polyamide.

45. The assembly of claim 33, wherein the section of tape can withstand temperature of substantially at least 250 degrees Centigrade.

46. The assembly of claim 33, wherein the section of tape covers at least 0.005 inches of the proximal ends of a portion of the lead fingers.

47. An assembly of a semiconductor integrated circuit device and a lead frame, said assembly comprising:

- a conventional-type lead frame including a periphery, a central portion, a center axis and a plurality of lead fingers, the plurality of lead fingers each having an end inwardly extending to define a semiconductor integrated circuit device opening in the conventional-type lead frame; and
- a section of tape having at least one slot formed therethrough, the section of tape attached proximate the periphery of the section of tape to at least a portion of the plurality of lead fingers at the ends thereof.

48. The assembly of claim 47, wherein the section of tape is substantially rectangular in shape.

49. The assembly of claim 47, further including at least two slots transversely extending across a portion of the section of tape.

50. The assembly of claim 47, further including at least two slots longitudinally extending across a portion of the section of tape.

51. The assembly of claim 49, wherein a first slot of said at least two slots is positioned proximate a first portion of the ends of the plurality of lead fingers and a second slot of said at least two slots is positioned proximate a second portion of the ends of the plurality of lead fingers.

52. The assembly of claim 47, wherein the at least one slot substantially diagonally extends across the section of tape.

53. The assembly of claim 47, wherein the at least one slot extends substantially transversely of the section of tape.

54. The assembly of claim 47, wherein the at least one slot substantially forms a grid of slots in the section of tape in at least a portion of the semiconductor integrated circuit device opening.

55. The assembly of claim 47, further including a semiconductor device attached to and supported by the section of tape.

56. The assembly of claim 55, wherein the semiconductor device substantially extends over at least a portion of the at least one slot.

57. The assembly of claim 47, wherein the section of tape is adhesively attached to said at least a portion of the plurality of lead fingers.

58. The assembly of claim 47, wherein the section of tape is formed of the group comprising plastic and polyamide.

59. The assembly of claim 47, wherein the section of tape can withstand temperatures of substantially at least 250 degrees Centigrade.

60. The assembly of claim 47, wherein the section of tape substantially covers at least 0.005 inches of the proximal ends of a portion of the lead fingers.

* * * * *